(12) United States Patent
Ochotta et al.

(10) Patent No.: US 7,620,927 B1
(45) Date of Patent: Nov. 17, 2009

(54) METHOD AND APPARATUS FOR CIRCUIT DESIGN CLOSURE USING PARTITIONS

(75) Inventors: Emil S. Ochotta, Mountain View, CA (US); William W. Stiehl, Lafayette, CO (US); Eric M. Shiflet, Boulder, CO (US); W. Story Leavesley, III, Longmont, CO (US)

(73) Assignee: XILINX, Inc., San Jose, CA (US)

( * ) Notice: Subject to any disclaimer, the term of this patent is extended or adjusted under 35 U.S.C. 154(b) by 357 days.

(21) Appl. No.: 11/639,618

(22) Filed: Dec. 15, 2006

(51) Int. Cl.
   *G06F 17/50* (2006.01)
(52) U.S. Cl. .......................................... 716/18; 716/16
(58) Field of Classification Search .................... 716/6, 716/8–10, 12–14, 16–18
   See application file for complete search history.

(56) References Cited

U.S. PATENT DOCUMENTS

| | | | |
|---|---|---|---|
| 5,436,849 A | 7/1995 | Drumm | |
| 5,805,861 A | 9/1998 | Gilbert et al. | |
| 6,102,964 A | 8/2000 | Tse et al. | |
| 6,298,319 B1 | 10/2001 | Heile et al. | |
| 6,490,717 B1 | 12/2002 | Pedersen et al. | |
| 6,871,336 B1 | 3/2005 | Anderson | |
| 6,996,832 B2 | 2/2006 | Gunduc et al. | |
| 7,023,744 B1 | 4/2006 | Shimanek et al. | |
| 7,086,029 B1 | 8/2006 | Barras et al. | |
| 7,134,112 B1 * | 11/2006 | Anderson et al. | 716/13 |
| 7,337,100 B1 | 2/2008 | Hutton et al. | |
| 7,490,312 B1 | 2/2009 | Ochotta | |
| 2002/0162077 A1 | 10/2002 | Jeng et al. | |
| 2004/0128626 A1 | 7/2004 | Wingren et al. | |
| 2005/0172251 A1* | 8/2005 | Chang et al. | 716/6 |
| 2005/0240892 A1 | 10/2005 | Broberg et al. | |

OTHER PUBLICATIONS

Ochotta, Emil S. etal., "Partition-Based Incremental Implementation Flow for Use with a Programmable Logic Device", filed Aug. 8, 2006, U.S. Appl. No. 11/501,156, pp. available from Xilinx, Inc., 2100 Logic Drive, San Jose, CA 95124.

Bell II, William R. et al., "Plug-In Component-Based Dependency Management for Partitions Within an Incremental Implementation Flow", filed Aug. 8, 2006, U.S. Appl. No. 11/500,525, pp. available from Xilinx, Inc., 2100 Logic Drive, San Jose, CA 95124.

Xilinx, Inc.; "Development System Reference Guide"; Chapter 3—Incremental Design; 2005; downloaded from http://toolbox.xilinx.com/docsan/xilinx7/books/docs/dev/dev.pdf; pp. 55-74.

(Continued)

*Primary Examiner*—Stacy A Whitmore
(74) *Attorney, Agent, or Firm*—Kevin T. Cuenot

(57) ABSTRACT

A method of implementing a circuit design can include selecting the circuit design to be implemented, wherein the circuit design comprises a plurality of partitions, and receiving a user input specifying a value of a partition property. The partition property can be associated with a selected one of the plurality of partitions of the circuit design. The method also can include performing an incremental implementation flow upon the circuit design for implementation by, at least in part, selectively modifying portions of a prior implementation of the selected partition in accordance with the value of the partition property.

20 Claims, 5 Drawing Sheets

OTHER PUBLICATIONS

U.S. Appl. No. 11/639,618, filed Dec. 15, 2006, Ochotta, Xilinx, Inc. 2100 Logic Drive, San Jose, CA.

U.S. Appl. No. 11/500,525, filed Aug. 8, 2006, Bell II et al, Xilinx, Inc. 2100 Logic Drive, San Jose, CA.

* cited by examiner

200

| Partition Property | Partition Property Values | Action or Behavior Caused by Partition Property for Stated Value |
|---|---|---|
| Preservation Level | Routing | Packing, placement, and routing of partition are locked unless partition is out of date. |
| | Placement | Synthesis, packing, and placement of partition are locked. Routing can be changed. |
| | Synthesis | Synthesis of partition is locked. Packing, placement, and routing of partition can be changed. |
| | Inherit | Value is determined by ascending partition hierarchy until partition is encountered with value for Preservation Level not equal to inherit. That value is selected as value for current partition. |
| Force Re-Implementation | Implementation | Perform only physical implementation steps (post synthesis) for partition. |
| | Synthesis | Perform synthesis and all subsequent implementation steps for partition regardless of whether the partition is out of date. |
| Lock | Ignore-Source-Changes | Reuse prior implementation of partition even if source code for partition has been modified. |
| | Ignore-Constraint-Changes | Reuse prior implementation of partition even if constraints that potentially affect partition have been modified. |
| | Ignore-Property-Changes | Reuse prior implementation of partition even if implementation option or command lines for implementation tool have changed from prior implementation. |
| Guide | Yes | Use leveraged guide to re-implement out-of-date partition. |
| | No | Re-implement out-of-date partition. |
| | Inherit | Value is determined by ascending partition hierarchy until partition is encountered with value for Guide not equal to inherit. That value is selected as value for current partition. |

FIG. 2

METHOD AND APPARATUS FOR CIRCUIT DESIGN CLOSURE USING PARTITIONS

BACKGROUND

An implementation flow refers to the various processes applied to a programmatic representation of a circuit design to implement that circuit design within a specific target programmable logic device (PLD) such as a field programmable gate array (FPGA). An implementation flow typically includes processes, or implementation stages, such as synthesis, translation, packing, placing, and routing. These implementation stages are applied to a hardware description language (HDL) description of the circuit design to derive the bitstream that ultimately programs the PLD.

Incremental implementation flow (incremental flow) refers to a methodology for processing circuit descriptions in a manner that attempts to reuse implementation data generated for selected portions of the circuit description. For example, if a particular section of a circuit description is not changed, but other portions are changed, the implementation data generated from synthesis, translation, packing, placing, and/or routing for the unchanged sections of the circuit description may be reused in subsequent incremental flows. Reuse of implementation data for unchanged sections means that those sections do not have to be reprocessed through the various stages of implementation. This can be beneficial, particularly where the circuit design undergoes only an incremental or minor change.

As an example, an incremental change can be one that affects only a portion of the design, for example, one branch of the design hierarchy, without affecting other parts of the design. Typically, an incremental change neither significantly alters the size of the circuit design nor adversely affects the timing of the circuit design as a whole. Still, an incremental change can be more substantive in that timing may be adversely affected. More specific examples of incremental design changes can include, but are not limited to, changes to state machines, control logic, or the addition of registers intended to improve performance of the circuit design.

Conventional software-based circuit design tools automatically determine which portions of a circuit design can be reused in an incremental flow from a prior implementation flow. Typically, this determination is made by identifying unchanged sections of the HDL circuit description and reusing the implementation data generated for those unchanged sections.

BRIEF SUMMARY OF THE INVENTION

The present invention is directed to incremental implementation flow for implementing a circuit design. The various stages of incremental implementation flow can be controlled or guided by the interpretation of one or more partition properties that are associated with the partitions of the circuit design by various circuit design tools. Selective modification, or prevention of modification(s), to one or more portions of the implementation data for a circuit design can be performed on a per-partition basis in accordance with the partition properties.

One embodiment of the present invention can include a method of implementing a circuit design. The method can include selecting the circuit design to be implemented, wherein the circuit design comprises a plurality of partitions, and receiving a user input specifying a value of a partition property. The partition property can be associated with a selected one of the plurality of partitions of the circuit design. The method also can include performing an incremental implementation flow upon the circuit design by, at least in part, selectively modifying portions of a prior implementation of the selected partition in accordance with the value of the partition property.

Selectively modifying portions of the prior implementation can include preventing any change to synthesis, packing, placement, or routing implementation information of the prior implementation of the selected partition, allowing only routing implementation information of the prior implementation of the selected partition to be changed during the incremental implementation flow, or allowing only packing, placement, and routing implementation information of the prior implementation of the selected partition to be changed during the incremental implementation flow.

Selectively modifying portions of the prior implementation further can include determining which portions of the partition are to be re-implemented through inheritance from a partition above the selected partition within a partition hierarchy, forcing at least one portion of the prior implementation of the selected partition to be re-implemented during the incremental implementation flow, or reusing the entire prior implementation of the selected partition during the incremental implementation flow when the selected partition is out-of-date. Selectively modifying portions of the prior implementation further can include selecting and applying a processing algorithm from a plurality of processing algorithms during at least one implementation stage of the incremental implementation flow according to the value of the partition property.

Another embodiment of the present invention can include a method of implementing a circuit design. The method can include selecting a circuit design for implementation, wherein the circuit design comprises a plurality of partitions. An analysis can be performed upon the circuit design and a first partition can be identified that does not meet a predetermined requirement of the circuit design. Responsive to identifying the first partition, the method can include relaxing a partition property of a second partition that is associated with the first partition. The partition property can regulate which portions of the second partition can be changed during an incremental implementation flow. The method also can include performing an incremental implementation flow on the circuit design, wherein the second partition is selectively modified during at least one stage of the incremental implementation flow according to the partition property.

In one aspect, the analysis can be a timing analysis. In that case, the method can include, responsive to identifying the first partition, selecting a partition as the second partition that has a critical path with the first partition and has a partition property indicating a preservation level above a minimum preservation level.

In another aspect, the analysis can be a power consumption analysis. Accordingly, the method can include, responsive to identifying the first partition, selecting a partition as the second partition that shares at least one of packing, placement, or routing with the first partition and has a preservation level above a minimum preservation level.

In still another aspect, the analysis can be an area usage analysis. In that case, the method can include, responsive to identifying the first partition, selecting a partition as the second partition that shares at least one of packing, placement, or routing with the first partition and has a partition property indicating a preservation level above a minimum preservation level.

Yet another embodiment of the present invention can include a machine readable storage, having stored thereon a computer program having a plurality of code sections for causing a machine to perform the various steps and/or functions disclosed herein.

BRIEF DESCRIPTION OF THE SEVERAL VIEWS OF THE DRAWINGS

FIG. 2 is a table illustrating partition properties which can be associated with partitions of a circuit design in accordance with another embodiment of the present invention.

DETAILED DESCRIPTION

Figure 1:
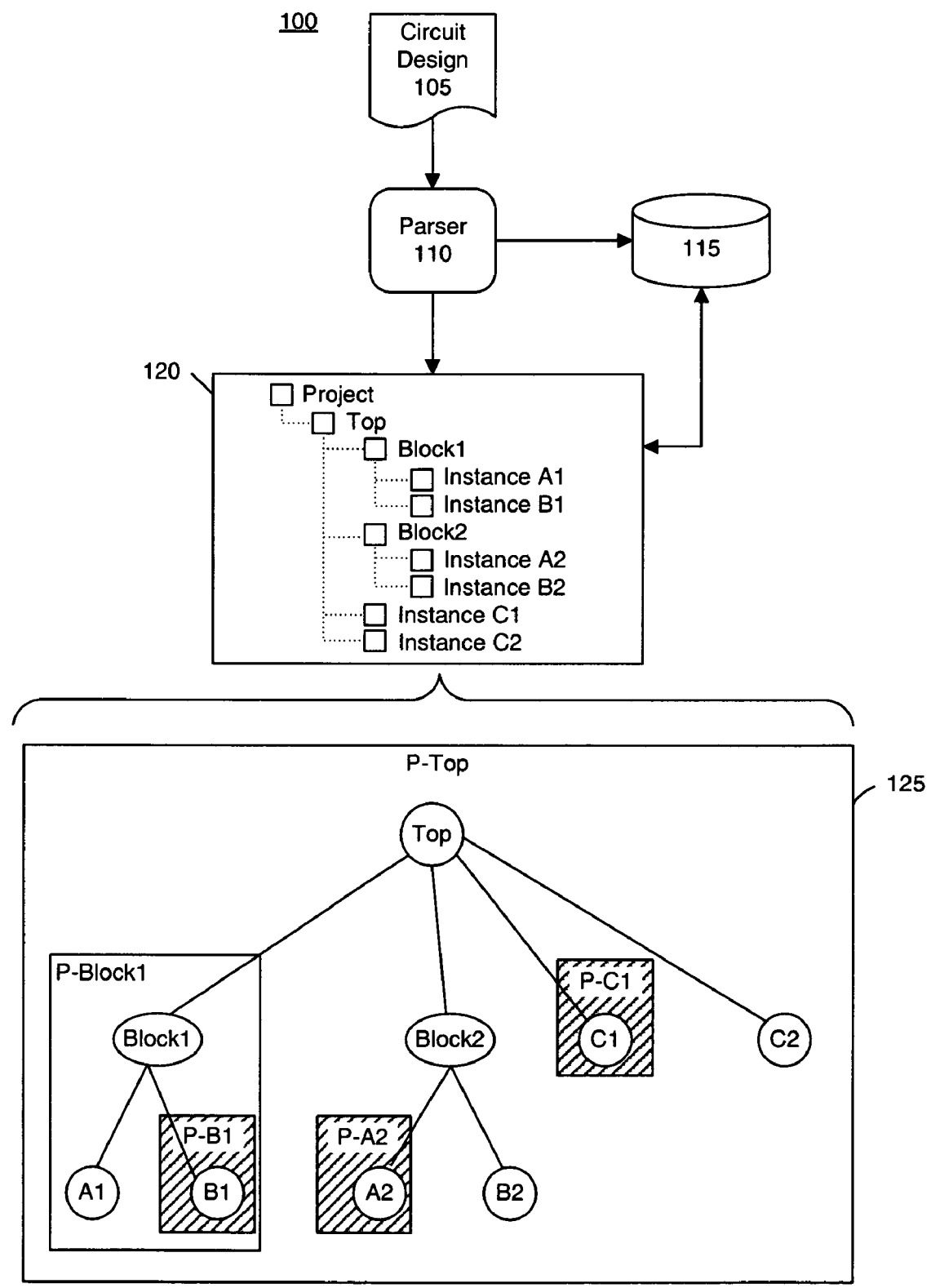
FIG. 1 is a block diagram illustrating the specification of partitions for a circuit design in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein are directed to implementing a circuit design within a programmable logic device (PLD) using incremental implementation flow (incremental flow). In the context of performing an incremental flow for a circuit design, values for properties can be specified and associated with partitions of the circuit design. These properties can be specified on a per-partition basis. During an incremental flow process, the partition properties can be interpreted by the implementation tool(s) to determine, for example, which portions of the implementation data for a partition are to be preserved, the degree to which partition data for the partition is to be preserved, as well as the manner in which prior implementation data for the partition is to be processed and incorporated into the incremental flow. Thus, for each stage of an incremental flow, i.e., synthesis, translation, packing, placing, and routing, the tool responsible for that implementation stage can reuse prior implementation data and/or re-implement partitions or portions of partitions based upon the values of partition properties associated with those partitions. Note that while the example of a PLD is used herein, the methods and techniques described herein may be applicable to the design of other types of integrated circuits, including partially programmable devices and ASICs.

As used herein, a partition refers to a portion of a circuit design that is defined by a user or circuit designer. Each partition is a group or collection of one or more circuit elements, e.g., lookup tables, registers, logic gates, processors, memories, etc. Partitions support hierarchical relationships commonly used within a hardware description language (HDL) representation of a circuit design. To create a partition, a circuit designer simply designates that a given instance, or module, of an HDL representation of a circuit design is a partition using a software-based circuit design tool. In general, any hierarchical unit or construct of the HDL circuit description that is formally defined within the syntax of the HDL language used can be designated as a partition.

FIG. 1 is a block diagram illustrating a system 100 for specifying partitions of a circuit design in accordance with one embodiment of the present invention. System 100 can include a parser 110, a data store 115, and a view 120 for use with a graphical user interface (GUI). In one embodiment, system 100 can be implemented as part of a software-based electronic design automation system or suite of tools. For example, system 100 can be implemented as the Xilinx™ Integrated Software Environment (ISE), which is available from Xilinx, Inc. of San Jose, Calif. Xilinx ISE provides the software tools necessary for a developer to process an HDL representation of a circuit design through the various stages of implementation up to device programming. (Xilinx is a trademark of Xilinx, Inc. in the United States, other countries, or both).

The parser 110 can process an HDL description of a circuit design 105. In one embodiment, the parser 110 can be implemented as, or similar to, a parser typically included within a synthesis tool such as, for example, Xilinx Synthesis Technology (XST). As known, synthesis is the process of converting behavioral HDL into a network of logic gates. A synthesis tool can process the HDL circuit design using a library of primitives, which can include logic gates as well as more complex primitives such as shift registers, arithmetic units, and the like.

Accordingly, the parser 110 can evaluate the circuit design 105 and identify the various modules and corresponding primitives defined therein as well as the individual instantiations of modules. Further information including, but not limited to, the hierarchical relationships among modules and module instantiations as well as connectivity can be determined. This information can be inferred by the parser 110 from the circuit design 105 and produced as output data. As shown, the output data can be stored within a data storage device (data store) 115. In one embodiment, the information can be organized in a database, such as a relational database, though the present invention is not limited to the use of such a data structure.

The data generated and stored within data store 115 can be presented to the user via view 120 which can be presented as, or as part of, a GUI. View 120 visually presents images, symbols, and/or text representing the various primitives of circuit design 105 to the user. Though shown in a hierarchical arrangement, the various circuit elements can be presented in any of a variety of different views and arrangements. In any case, view 120 provides a mechanism through which a circuit designer can specify partitions for circuit design 105.

View 120 allows a circuit designer to specify partitions for circuit design 105 on any of a variety of different hierarchical levels. In illustration, the "Top" block in view 120 can include two hierarchical blocks, denoted as "Block1" and "Block2", as well as two instances "C1" and "C2". The hierarchical block denoted as "Block1" can contain two instances "A1" and "B1". Similarly, the hierarchical block denoted as "Block2" can contain two instances "A2" and "B2". For illustrative purposes, the instances "A1" and "A2" are instantiations of some module "A", instances "B1" and "B2" are instantiations of some module "B", and instances "C1" and "C2" are instantiations of some module "C". Through view 120, a partition can be defined that corresponds to any of the instances "A1", "A2", "B1", "B2", "C1", or "C2" or hierarchical blocks such as Block1 or Block2 under "Top". In one aspect, a "block" can refer to an HDL construct such as a module or an instance. In another aspect, however, a "block" can refer to an artifact of the underlying circuit representation.

In one embodiment, the partitions can be defined by a circuit designer. For example, the designer can select an instance or block and issue a partition command. Such a command can be available via a drop down menu, via a pop-up style menu responsive to a right click of a pointing device, through a command line interface such as Tool Command Language (Tcl), etc. In another embodiment, the designer may choose to use an automated partitioning technique available from a software program. Regardless, a GUI can be presented through which the designer can specify various attributes, i.e., partition properties to be described in further detail herein, relating to the partition(s) being defined.

View 125 illustrates the hierarchical nature in which partitions can be specified for circuit design 105. In one embodiment, view 125 can be presented as, or as part of, a GUI. As shown in view 125, a partition called "P-Top" has been created that corresponds to the "Top" block in the design. Partitions "P-B1", "P-A2", and "P-C1" have been created to encompass instances "B1", "A2", and "C1" respectively. In addition, partition "P-Block1" has been created to encompass the hierarchical block "Block1" and any remaining instances that have not been partitioned under "Block1", in this case "A1". Since there are no partitions for instances "B2" or "C2" or hierarchical block "Block2", the instance "B2" and "C2" are contained within partition "P-Top."

The hierarchical nature of partitions can be observed in that partition "P-B1" is a child of partition "P-Block1". Accordingly, partition "P-Block1" is the parent of partition "P-B1". Similarly, partition "P-top" is the parent of partitions "P-Block1", "P-A2", and "P-C1". Conversely, partitions "P-Block1", "P-A2", and "P-C1" are children of partition "P-Top."

Each of the partitions can be associated with one or more partition properties. A partition property is a parameter that influences how the partition, or its corresponding implementation data, is to be processed or handled during one or more stages of incremental flow. A more detailed description of exemplary partition properties follows with reference to FIG. 2.

Within the hierarchy of partitions, partition properties can be inherited by child partitions from parents. In illustration, through inheritance, if a parent partition has a specified value for a partition property, the child partition can inherit that value of the partition property. Still, the circuit designer can override and/or assign any desired value to a partition property to manage an incremental flow with a finer degree of granularity and control. Values for partition properties can be specified by a circuit designer via views 120 and/or 125, through a command line interface, and/or through one or more source files.

In addition to partition properties, other information such as implementation data also can be associated with a partition. For example, implementation data pertaining to partition P-A1, and thus instance A1, as is generated from one or more stages, e.g., synthesis, translation, mapping, packing, placement, and routing, of an implementation flow can be associated with the partition for potential reuse in a subsequent incremental flow. Information such as partition properties and implementation data can be stored in data store 115. As noted, such information can be stored using a relational database or other suitable data structure.

FIG. 2 is a table 200 illustrating partition properties which can be associated with partitions of a circuit design in accordance with another embodiment of the present invention. Table 200 includes 4 exemplary types of partition properties. The partition property types include preservation level, force re-implementation, lock, and guide. It should be appreciated that more partition property types can be specified and that the embodiments disclosed herein are not intended to be limited solely to those properties listed. Each of the partition property types can be assigned a particular value and be associated with partitions of a circuit design on a per-partition basis. This provides the user, or circuit designer, with a greater amount of control over the incremental flow process.

The "preservation level" type of partition property, in general, dictates the particular portions of implementation data for the partition from a prior implementation or incremental flow that can be re-implemented and those that are locked and, thus, reused. As used herein, the phrase "portion of implementation data" for the partition has been used to refer to the implementation information generated for a partition during a specified phase of incremental or implementation flow. For example, as shown, possible values for the preservation level partition property (property), can include, but are not limited to, routing, placement, synthesis, or inherit. The preservation level property applies, or is interpreted by a design tool, only when a partition is being reused within an incremental flow. As such, the preservation level property only influences an incremental flow when one or more other partitions in the circuit design are being re-implemented during that incremental flow.

A value of "routing" for the preservation level property indicates that synthesis, packing, placement, and routing of a partition having this preservation level property value are to be locked unless the partition is considered out-of-date. A partition can be considered out-of-date when one or more aspects of the partition, with the exception of the partition properties, have changed. For example, if the underlying HDL code of a partition, one or more constraints affecting a partition, implementation tool options, or the like are newer than the implementation data for the partition, that partition can be said to be "out-of-date". Thus, a value of "routing" for the preservation level property indicates that portions of the implementation data generated by synthesis, packing, placement, and routing need not be regenerated when the partition is not out-of-date. Instead, such implementation data is locked and reused within, or pasted into, the incremental flow of the circuit design. A value of "placement" for the preservation level property indicates that synthesis, packing, and placement portions of the implementation data for the partition are locked and are not subject to change during an incremental flow. Routing, and thus the routing implementation information, however, can be changed.

A value of "synthesis" for the preservation level property indicates that only synthesis information for the partition is locked. As such, packing, placement and routing for a partition having a preservation level property value of "synthesis" can be re-executed or re-implemented during an incremental design flow to update or create new packing, placement, and routing implementation data. Thus, the packing, placement, and routing of the partition, and the partition itself, can be said to have been modified or changed as compared to a prior implementation of the partition. Synthesis implementation data from a prior incremental flow is reused. A value of "inherit" for the preservation level property indicates that the partition hierarchy is ascended from the selected partition until a partition is encountered that has a preservation level property with a value other than "inherit". The value of that preservation level property can then be applied to the selected partition.

From the above description of the preservation level property, it can be seen that the different values that can be assigned vary in terms of the level, or amount, of implementation data that is reused on a per-partition basis. The different levels become less restrictive, or more relaxed, as the values of the preservation property are traversed from routing, to placement, to synthesis. One example of how the preservation level property may be used is in the case where partitions that have not been changed are utilizing critical resources of the PLD. These resources, i.e., particular PLD components or wiring resources, may be needed by partitions of the circuit design that have been changed. In such cases, it may be useful to relax the preservation level on an unchanged partition. Doing so has the effect of releasing resources from the unchanged partition so that those resources are available to the more "needy" partition. This technique further allows as much of the partition implementation to be retained as possible.

The "force re-implementation" type of partition property causes a partition to be re-implemented at the level specified by the force re-implementation value. The force re-implementation property allows a circuit designer to cause a partition to be re-implemented in cases where that partition otherwise would not be re-implemented, i.e., the partition has not changed. A value of "implementation" for the force re-implementation property will cause the partition to undergo only physical implementation steps, i.e., those stages of an incremental flow that are performed post synthesis. A value of "synthesis" for the force re-implementation property will cause the partition to undergo synthesis as well as all subsequent stages of incremental flow. This occurs regardless of whether the partition is considered out-of-date.

One example of how the force re-implementation property can be used in the context of an incremental flow is the case where a particular partition has not changed over one or more or many incremental flows. While it may not be necessary to re-implement such a partition of the circuit design as it may continue to function properly and meet established design constraints, it also may be the case that the partition is no longer optimal in relation to the other portions of the circuit design. Such re-implementation of a partition may not be necessary but can provide significant benefits in terms of system level performance and the optimality of other partition implementations.

The "lock" type of partition property prevents re-implementation of a partition where the partition otherwise would be re-implemented. In other words, the lock property forces the reuse of implementation data for the partition within an incremental flow. In one aspect, the lock property can be viewed as the opposite of the force re-implementation property. A value of "ignore-source-changes" for the lock property will cause the implementation data for the partition to be reused despite the underlying source code that specifies the partition having been changed. A value of "ignore-constraint-changes" for the lock property forces the reuse of the implementation data for a partition despite one or more design constraints that affect the partition having been changed. A value of "ignore-property-changes" for the lock property causes the reuse of implementation data for the partition within an incremental flow despite one or more implementation options for an implementation tool, e.g., a placer or router, having been changed. Similarly, the value "ignore-property-changes" can cause the reuse of implementation data for the partition in the case where one or more parameters of a command line instruction for the implementation tool have been changed from a prior use of the implementation tool on the partition.

One example of how the lock property can be used is in the case where a dependency management application or service determines automatically that a partition is to be re-implemented. A dependency management service, which can be included within a circuit design tool, can reach such a conclusion in the cases enumerated with respect to the different values of the lock property, i.e., the source code that specifies the partition has changed, design constraints relating to the partition have changed, one or more implementation options have changed, and/or one or more parameters of a command line instruction of an implementation tool have changed. For example, if one or more of the inputs to the partition have changed, but the circuit designer does not wish to spend tool runtime re-implementing the partition, or the partition has already been subjected to rigorous testing and/or verification, the lock property can be set.

In one embodiment, as implementation data can be stored within a relational database, implementation data that is to be reused can be copied directly from the prior implementation database into the database for the incremental flow, or current implementation process. Implementation data for partitions that are not re-implemented in the incremental flow can be copied, or grafted, from the relational database storing prior implementation data into the data for the (new) incremental flow. Grafting the information from a prior flow can be analogized to copying and pasting one or more branches of a hierarchical tree of implementation data into the new implementation.

To graft implementation data into an incremental flow, the name of a partition must match a module instance in the design hierarchy. The implementation data is grafted within the database directly. Error handling is required to accommodate cases in which the instance has been deleted or renamed.

The "guide" type of partition property causes the implementation tools corresponding to the different stages of incremental flow to reuse as much of the partition implementation as possible. Such can be the case despite the partition being out-of-date. That is, as much of the partition implementation is reused as is possible despite changes to the inputs to the partitions, the source code specifying the partition, etc. Otherwise, the default behavior of the implementation tools is to abandon the prior implementation and completely re-implement the partition.

A value of "yes" for the guide property can cause the implementation tools to use a leveraged guide process to re-implement out-of-date partitions. The leveraged guide process utilizes results from a prior phase of implementation flow, e.g., synthesis, translation, mapping, packing, placing, and/or routing, for the circuit design. These results, referred to as guide files, are used during incremental flow to guide implementation of unchanged portions of the circuit design. The guide technique performs correlation among leaf blocks (e.g., LUTs and Flip-Flops) in the implementation hierarchy. Once correlation has been performed, the guide technique attempts to constrain the implementation to be the same as the correlated results.

A value of "no" for the guide property can cause the implementation tools to re-implement an out-of-date partition. A value of "inherit" for the guide property causes the implementation tools to ascend the partition hierarchy in which the selected partition is located until a partition is found having a guide property that is not equal to "inherit". That value can be used for the guide property for the selected partition.

One example of utilizing the guide property within an incremental flow can be where a change to the source code, e.g., the HDL, specifying a partition is small. In that case, abandoning a prior implementation of the partition and re-implementing the partition from scratch can require a significant amount of tool runtime. Further, setting the guide property to "yes" may improve the ability of the implementation tools to maintain the previous circuit performance for that partition.

In another embodiment, partitions can be associated with one or more partition properties that specify different implementation options. An implementation option can be a parameter that influences how the partition is to be processed or handled during incremental flow. One example of an implementation option can be "effort-level". An effort level can indicate the amount of effort that is to be expended by the design tool to accomplish a particular task, such as synthesis, place and route, etc.

For instance, effort level can control the amount of time needed to accomplish a task and possibly the quality of the result by selecting a more or less CPU-intensive algorithm. It should be appreciated that effort level is but one type of implementation option and that many other implementation options can be specified for each phase of the implementation flow. For example, other implementation options can include, but are not limited to, retiming during synthesis, register duplication, and optimization for area, timing, power, and the like.

Figure 3:
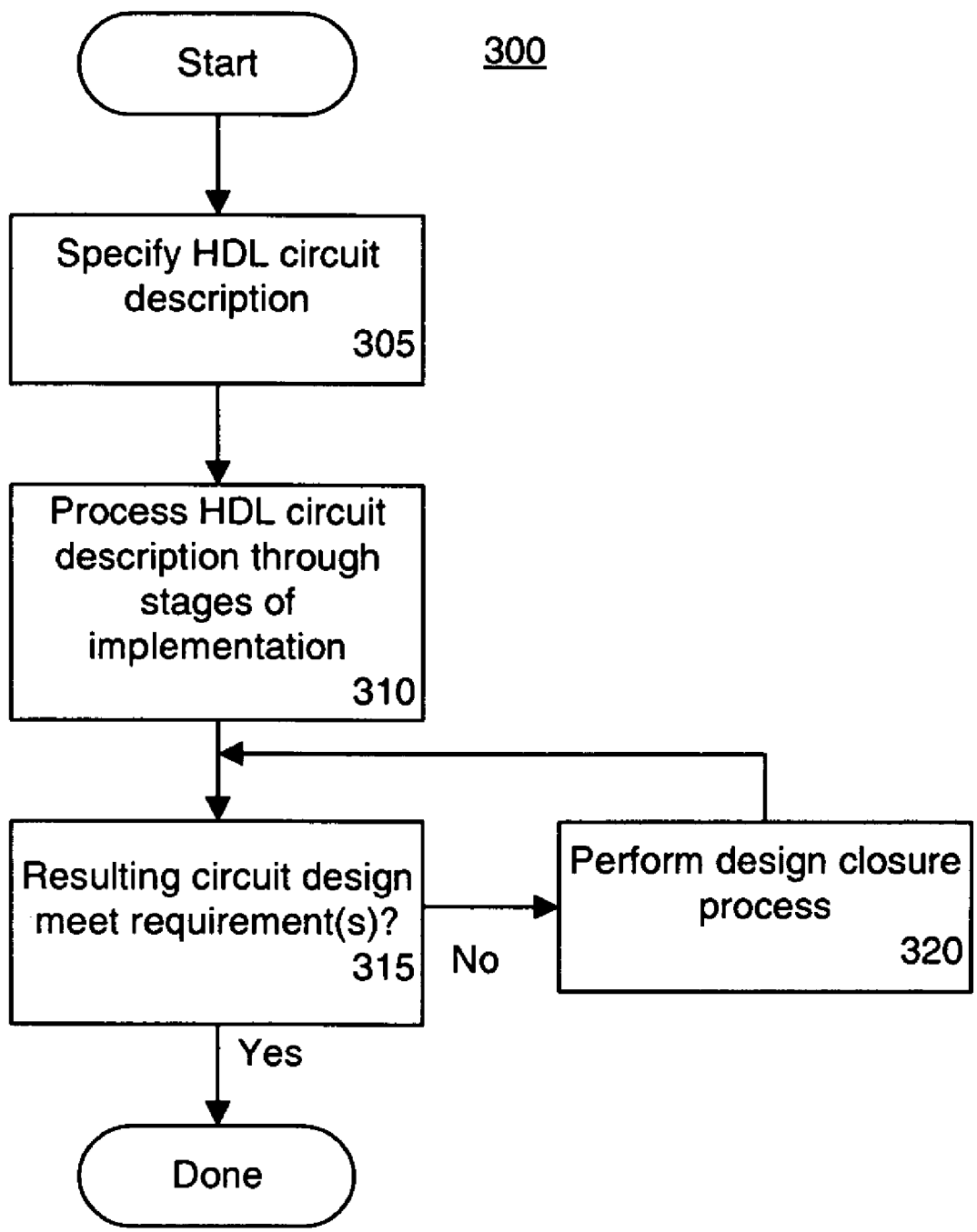
FIG. 3 is a flow chart illustrating a method of implementing a circuit design using incremental implementation flow in accordance with another embodiment of the present invention.

FIG. 3 is a flow chart illustrating a method 300 of implementing a circuit design which incorporates incremental flow in accordance with another embodiment of the present invention. The method 300 is described in a general fashion that can be applied to an evaluation of the circuit design with respect to one or more timing constraints, power usage constraints, and/or area constraints. Accordingly, the method 300 can begin in step 305 where an HDL circuit description for a circuit design to be implemented within a target PLD is specified or created by a circuit designer or user. In step 310, the HDL circuit description can be processed through the various stages, e.g., synthesis, translation, packing, placing, and routing, of implementation for a given target PLD.

In step 315, an analysis can be performed upon the resulting circuit design and a determination can be made as to whether the circuit design, or various partitions thereof, meet the requirements that have been established for the circuit design. The analysis can be a timing analysis, in relation to timing constraints, a power consumption analysis, in relation to power consumption constraints, or an area usage analysis, in relation to area usage requirements, or any other type of constraint, including combinations of constraints. It should be appreciated that in evaluating whether a requirement is met, such a determination can be made on a per partition basis, e.g., in the case where a timing constraint, power constraint, or area constraint is specified for a particular partition. In another example, timing, power, and area evaluations can be made for a plurality of partitions or for all partitions of the circuit design. In that case, the contribution of partitions can be identified and quantified in terms of the circuit design meeting, exceeding, or failing a particular requirement. If the circuit design does not meet the requirements, i.e., fails, the method can proceed to step 320 to perform a design closure process that will be described in further detail with reference to FIG. 4. After performing the design closure process, the method can end.

A partition or circuit design can be said to meet a timing requirement when the time needed for a signal to propagate from one specified point in the circuit design to another is the same as or less than the time specified by the design constraint or requirement for the signal to propagate. If the circuit design fails a timing requirement, the amount of time needed for the signal to propagate was larger than the time specified in the timing constraint. In that case, the time required for the signal to propagate exceeded the allotted time specified in the design constraint. Partition(s), i.e., one or more partitions or the entire circuit design, can be said to meet a power requirement when the circuit design, or designated portion thereof, consumes an amount of power that is less than or equal to an amount of power specified by a power requirement. Partition (s) can be said to meet an area requirement when the circuit design, or the specified portion thereof, occupies an amount of area of the target device that is less than or equal to the amount of area specified by the area requirement.

Figure 4:
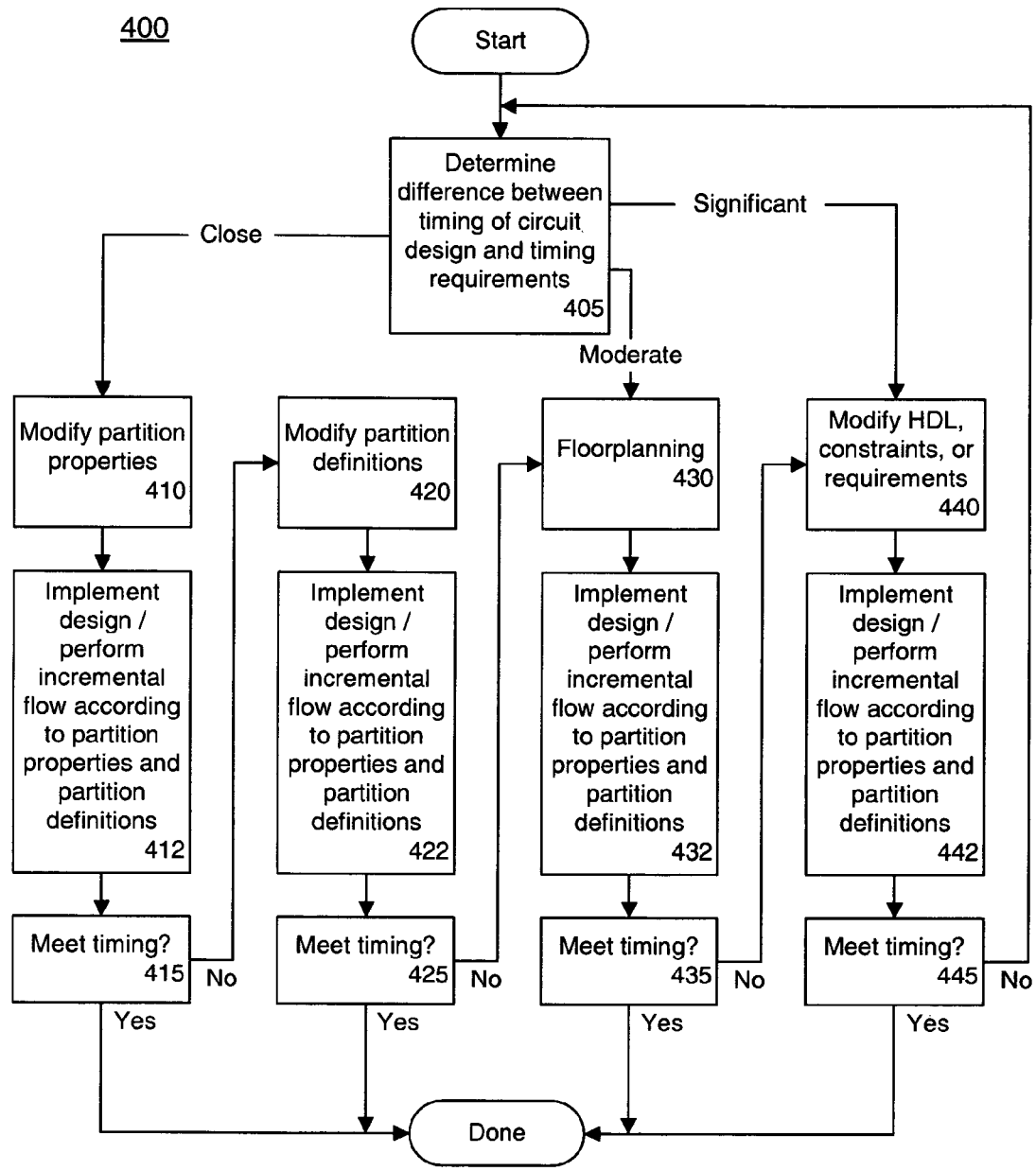
FIG. 4 is a flow chart illustrating a method of implementing a design closure process in accordance with another embodiment of the present invention.

FIG. 4 is a flow chart illustrating a method 400 of implementing a design closure process in accordance with another embodiment of the present invention. The design closure process of FIG. 4 can be used or performed as step 320 of FIG. 3. For purposes of illustration, the method 400 illustrates a timing closure process. It should be appreciated, however, that a similar process can be performed to meet other requirements, e.g., power consumption requirements and/or area requirements, etc.

Accordingly, the method can begin in step 405 where the difference between the timing of the circuit design and the established timing requirements for the circuit design can be determined. That is, the amount of time needed for selected signals to pass from one location in the circuit design to another, which exceeds the time specified by the timing requirements, can be determined. Depending upon the magnitude of the difference, e.g., whether the difference is considered close, moderate, or significant, the method can branch to either step 410, 430, or 440 for further processing.

In the case where the difference between the timing of the circuit design and the timing requirements established for the circuit design is considered close, the method can proceed to step 410. In one embodiment, the difference between the circuit design timing and the timing requirements can be considered close if the timing of the circuit design is within a predetermined amount as may be measured in terms of a percentage of a timing requirement, a number of clock cycles, or the like. For example, "close" can mean that the timing of the circuit design is no more than 5% greater than a given timing requirement, no more than 10% greater than a timing requirement, or no more than a particular number of clock cycles greater than the timing requirement.

In another embodiment, the timing of the circuit design can be considered to be close if less than a predetermined number of a plurality of timing requirements for the circuit design are not met. As an example, if fewer than 10, 5, 4, 3, or 2 timing constraints are not met out of the total number of timing constraints for the circuit design, the timing of the circuit design can be considered close. Still, it should be appreciated that a combination of the two metrics can be used and applied, i.e., only a limited number of timing requirements are not met and, of the timing requirements that are not met, none is failed by more than a given percentage.

In step 410, one or more properties of selected partitions can be modified. In one embodiment, partition properties can be relaxed or made less restrictive. The manner in which partition properties can be modified will be discussed in greater detail with reference to FIG. 5. Having modified the partition properties of one or more partitions, the method can proceed to step 412 where an incremental flow can be performed. The incremental flow will be performed in accordance with the partition properties in effect and the partition definitions in effect. Accordingly, it should be appreciated that one or more partitions can be modified, locked, and/or processed as specified by the partition properties described herein. In step 415, a determination can be made as to whether the resulting circuit design meets the established timing requirements. If the circuit design meets the timing requirements, the method can end. If not, the method can proceed to step 420.

In step 420, one or more partitions are added or removed from the design. That is, the partition constraints, i.e., the mechanisms that define the partition, within the circuit design are removed, but not the components or other circuit structures of the partition. After modifying the partition definitions, an incremental flow can be performed in step 422. As noted, the incremental flow will be performed in accordance with the partition properties and partition definitions currently in effect. In step 425, a determination can be made as to whether the circuit design meets or exceeds the established timing requirements. If the timing requirements are met, the method can end. If not, the method can proceed to step 430.

Step 430 can serve as the next step in terms of trying to modify the circuit design to meet timing requirements. Step 430 also can be the step to which the method jumps when the difference between the timing requirements and the timing of the circuit design is considered moderate after step 405. The difference between the timing of the circuit design and the timing requirements can be considered moderate if a given metric is above the upper threshold for being considered close, and below the lower threshold for being considered significant. For example, if the number of timing requirements not met for the circuit design falls within some range such as 5-10, 5-15, 10-20, etc., the timing can be considered close. Alternatively, the difference can be measured in terms of the closeness of the timing of the circuit design with respect to a given timing requirement as measured in clock cycles, a percentage of the timing requirement, etc. In that case, the ranges for being considered close can be specified as 5%-10%, 5%-15%, 10%-20%, or the like. As noted, a combination of metrics can be used. In step 430, the circuit design can be floorplanned. In step 432, an incremental flow can be performed in accordance with the partition properties and partition definitions currently in effect. Again, in step 435, a determination can be made as to whether the timing requirements for the circuit design have been met after any necessary processing through an incremental flow. If so, the method can end. If not, the method can continue to step 440.

Step 440 can be the next step in the process of design closure. Step 440 further can be the step to which the method jumps when the difference between the timing requirements and the timing of the circuit design is considered significant in step 405. The timing difference can be considered significant if the timing difference is greater than the upper bound of what is considered moderate as measured by any metric or combination of metrics discussed herein. In step 440, after other techniques have been attempted, the HDL circuit design can be changed and/or the requirements can be lowered. Thus, the HDL circuit description can be modified, one or more circuit design constraints can be modified or relaxed, and/or one or more circuit design requirements can be modified. In step 442, an incremental flow can be performed in accordance with the partition properties and partition definitions currently in effect. In step 445, a determination can be made as to whether the timing of the circuit design meets or exceeds the timing requirements. If so, the method can end. If not, the method can loop back to step 405 to continue processing.

When implementing a methodology similar as discussed with reference to FIG. 4 in the context of area or power, the determination as to whether the circuit design is close, moderate, or significantly different from a design requirement can be measured in fashion as described above. For example, the ranges and/or percentages can be similar, or the same, in terms of the amount by which a circuit design exceeds a given power or area requirement, the number of power and/or usage requirements failed out of the total number of such requirements specified for the circuit design, or some combination the various metrics disclosed herein.

It should be appreciated that the method of FIG. 4 illustrates various steps that can be performed in an automated fashion or semi-automated fashion using a circuit design tool. In one embodiment, for example, the modification of partition properties can be performed in an automated manner to continually execute one or more incremental flows in accordance with the modified, or relaxed, partition properties.

Figure 5:
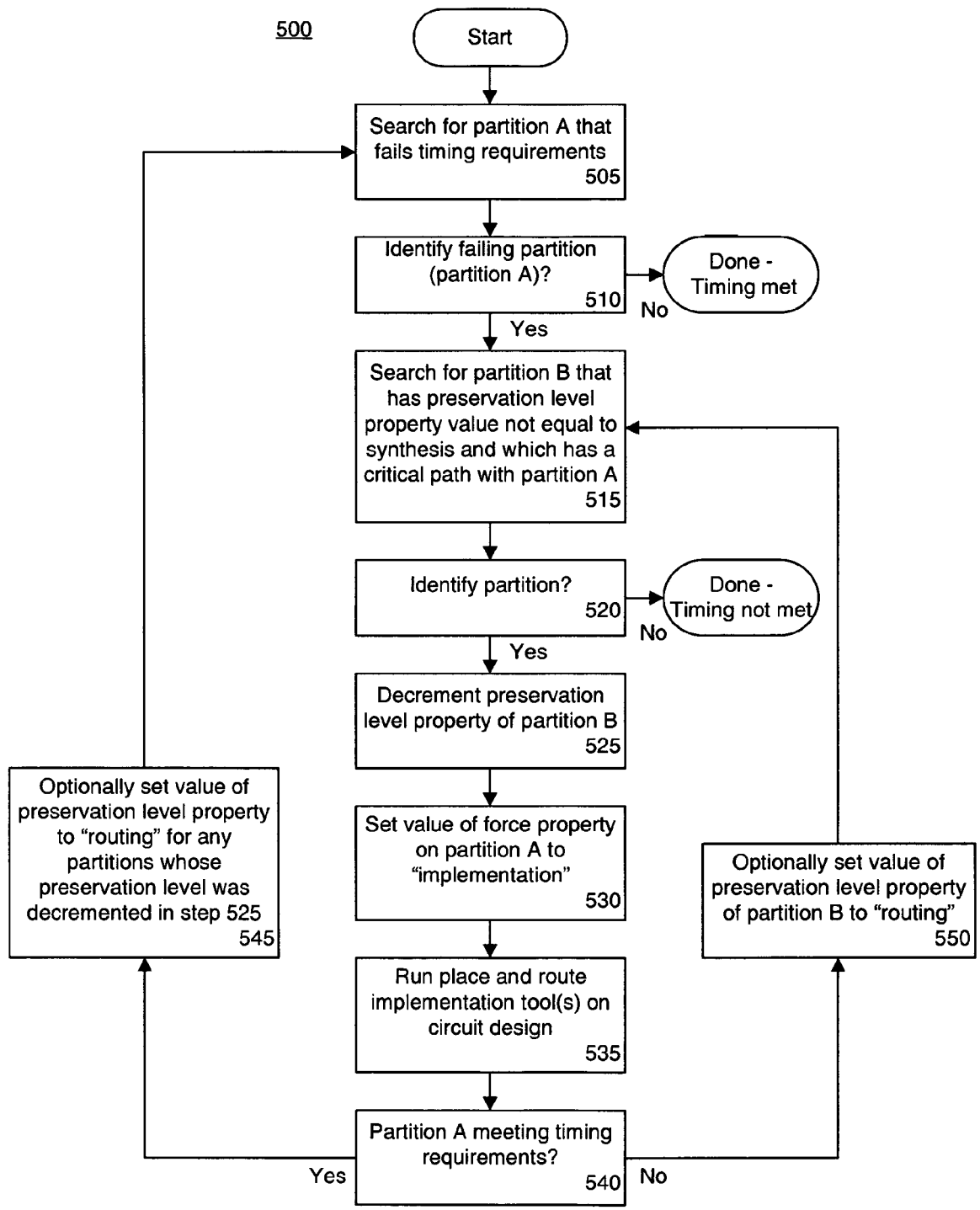
FIG. 5 is a flow chart illustrating a method of modifying partition properties in accordance with another embodiment of the present invention.

FIG. 5 is a flow chart illustrating a method 500 of modifying partition properties in accordance with another embodiment of the present invention. The method 500 can be implemented as one possible embodiment of performing step 410 of FIG. 4. As such, the steps illustrated in FIG. 5 can be performed automatically by a circuit design tool as noted. Further, it should be appreciated that the method 500 can be performed in the context of meeting a power requirement or an area requirement as opposed to a timing requirement if so desired.

The method 500 can begin in step 505, where a search for a partition, referred to as partition A, that has failed to meet timing requirements is performed. In step 510, a determination can be made as to whether such a partition was identified. If so, the method can proceed to step 515. If not, the method can end as timing requirements have been met, i.e., no partition can be identified that has failed to meet established timing requirements for the circuit design.

In step 515, a search for a partition, referred to as partition B, that has a value that is not equal to "synthesis", or the lowest (most relaxed) setting, for its preservation level property and which also shares a critical path with partition A can be performed. In step 520, if such a partition is identified, the method can proceed to step 525. If no such partition is identified, the method can end as timing requirements were not met.

Continuing with step 525, the value of the preservation level of partition B can be relaxed or decremented. For example, if the value of the preservation level of partition B is "routing", the level can be decremented or relaxed to a value of "placement". If the value of the preservation level of partition B is "placement", the value can be decremented to "synthesis". As synthesis is the lowest level of preservation possible, no further relaxation of that value can be performed.

In step 530, the force re-implementation property of partition A can be set to "implementation" which causes partition A to be re-implemented with respect to all post synthesis processes, i.e., packing, placement, and routing. The guide value of partition A can be set to "yes" in an effort to preserve its implementation as much as possible.

In step 535, place and route implementation tools can be run upon the circuit design and function as specified with respect to any partition properties that have been specified. It should be appreciated that an incremental implementation flow need not include each stage of implementation, but rather can apply only those stages that are needed in accordance with the various partition properties that have been specified for the partitions of the circuit design. That is, one or more stages of an incremental implementation flow can be performed upon selected partitions depending upon which partitions, or portions thereof, are to be re-implemented and which portions of implementation data for the partitions are to be reused.

In step 540, a determination can be made as to whether partition A meets the established timing requirements. If so, the method can loop to step 545, where the preservation level property for any partition whose preservation level property was decremented in step 525 can be set to "routing". Setting the preservation level property to "routing" effectively locks the implementation data for those partitions and prevents further modifications with respect to packing, placement, and routing. After step 545, the method can loop back to step 505 to continue processing as described. If partition A does not meet timing requirements in step 540, the method can proceed to step 550.

In one embodiment, in step 550, the preservation level can remain at its decremented level. In that case, in step 515, if the preservation level property has been decremented to "placement", the same partition can be selected as partition B. Accordingly, the preservation level property of that partition can be further decremented in step 525.

In another embodiment, if the preservation level property is already set to "synthesis", another partition can be selected as partition B in step 515. Thus, two or more partitions can be implemented with reduced preservation level properties in step 535, i.e., one partition processed as partition B during each iteration. In this embodiment, the preservation level property of partition B can be set to "routing" in step 550 prior to a further iteration to prevent further modifications to that partition. Accordingly, in step 515, the next partition can be selected as partition B.

As noted, the various steps described with reference to FIGS. 3, 4, and 5 also can be applied to cases relating to power usage and/or area usage or any other types of constraints or requirements. In the case of power usage or area usage, for example, a partition that fails such a requirement can be identified. A second partition that is associated with the failing partition can be selected. In one embodiment, the second partition can be one that shares one or more of packing, placement (in terms of circuit components) or a routing resource with the failing partition. Thus, if a failing partition A is identified, a partition B can be identified as one that shares packing, placement, routing, or any combination thereof with partition A.

The partition B also can have a preservation level partition property that is not the lowest, or most relaxed value, as the preservation level of partition B will be reduced as discussed with reference to FIG. 5. For example, the preservation level of partition B can be set, or relaxed, to "synthesis" to allow one or more of packing, placement, and/or routing to change during an incremental implementation flow for partition B. To allow only routing to change, the preservation level can be set to "placement".

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One embodiment of the present invention can be realized in the form of hardware or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods. A computer usable medium can include, but is not limited to, optical storage media, magnetic storage media, or computer memory.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e. open language. The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. Within a computer-based circuit design system, a method of implementing a circuit design comprising:

storing the circuit design to be implemented within memory, wherein the circuit design comprises a plurality of partitions;

receiving, within the circuit design system, a user input specifying a value of a partition property for each of the plurality of partitions; and the circuit design system performing an incremental implementation flow upon the circuit design by, at least in part, selectively modifying a prior implementation of selected ones of the plurality of partitions during selected stages of the incremental implementation flow in accordance with the value of the partition property of each one of the plurality of partitions.

2. The method of claim 1, wherein selectively modifying portions of the prior implementation further comprises preventing any change to synthesis, packing, placement, or routing implementation information of the prior implementation of the selected partition.

3. The method of claim 1, wherein selectively modifying portions of the prior implementation further comprises allowing only routing implementation information of the prior implementation of the selected partition to be changed during the incremental implementation flow.

4. The method of claim 1, wherein selectively modifying portions of the prior implementation further comprises allowing only packing, placement, and routing implementation information of the prior implementation of the selected partition to be changed during the incremental implementation flow.

5. The method of claim 1, wherein selectively modifying portions of the prior implementation further comprises determining which portions of the partition are to be re-implemented through inheritance from a partition above the selected partition within a partition hierarchy.

6. The method of claim 1, wherein selectively modifying portions of the prior implementation further comprises forcing at least one portion of the prior implementation of the selected partition to be re-implemented during the incremental implementation flow.

7. The method of claim 1, wherein selectively modifying portions of the prior implementation further comprises reusing the entire prior implementation of the selected partition during the incremental implementation flow when the selected partition is out-of-date.

8. The method of claim 1, wherein selectively modifying portions of the prior implementation further comprises selecting and applying a processing algorithm from a plurality of processing algorithms during at least one implementation stage of the incremental implementation flow according to the value of the partition property.

9. The method of claim 1, wherein the step of selecting comprises selecting the circuit design to be implemented within a programmable logic device.

10. Within a computer-based circuit design system, a method of implementing a circuit design comprising:
    storing a circuit design for implementation within memory, wherein the circuit design comprises a plurality of partitions;
    the circuit design system performing an analysis upon the circuit design and identifying a first partition that does not meet a predetermined requirement of the circuit design;
    responsive to identifying the first partition, the circuit design system relaxing a partition property of a second partition that is associated with the first partition, wherein the partition property regulates which portions of the second partition can be changed during an incremental implementation flow and during which stages of the incremental implementation flow the portions of the second partition are processed; and
    performing the incremental implementation flow on the circuit design, wherein the second partition is selectively modified during at least one stage of the incremental implementation flow according to the partition property.

11. The method of claim 10, wherein the analysis is a timing analysis, the method further comprising, responsive to identifying the first partition, selecting a partition as the second partition that has a critical path with the first partition and has a partition property indicating a preservation level above a minimum preservation level.

12. The method of claim 10, wherein the analysis is at least one analysis selected from the group consisting of a power consumption analysis and an area usage analysis, the method further comprising, responsive to identifying the first partition, selecting a partition as the second partition that shares at least one of packing, placement, or routing with the first partition and has a preservation level above a minimum preservation level.

13. A computer program product comprising:
    a computer usable medium having computer usable program code that, when executed by a computer, implements a circuit design, said computer program product including:
    code that selects the circuit design to be implemented, wherein the circuit design comprises a plurality of partitions;
    code that receives a user input specifying a value of a partition property for each of the plurality of partitions; and
    code that performs an incremental implementation flow upon the circuit design by, at least in part, selectively modifying a prior implementation of selected ones of the plurality of partitions during selected stages of the incremental implementation flow in accordance with the value of the partition property of each one of the plurality of partitions.

14. The computer program product of claim 13, wherein the code that selectively modifies portions of the prior implementation further comprises code that prevents any change to synthesis, packing, placement, or routing implementation information of the prior implementation of the selected partition.

15. The computer program product of claim 13, wherein the code that selectively modifies portions of the prior implementation further comprises code that allows only routing implementation information of the prior implementation of the selected partition to be changed during the incremental implementation flow.

16. The computer program product of claim 13, wherein the code that selectively modifies portions of the prior implementation further comprises code that allows only packing, placement, and routing implementation information of the prior implementation of the selected partition to be changed during the incremental implementation flow.

17. The computer program product of claim 13, wherein the code that selectively modifies portions of the prior implementation further comprises code that determines which portions of the partition are to be re-implemented through inheritance from a partition above the selected partition within a partition hierarchy.

18. The computer program product of claim 13, wherein the code that selectively modifies portions of the prior implementation further comprises code that forces at least one portion of the prior implementation of the selected partition to be re-implemented during the incremental implementation flow.

19. The computer program product of claim 13, wherein the code that selectively modifies portions of the prior implementation further comprises code that reuses the entire prior implementation of the selected partition during the incremental implementation flow when the selected partition is out-of-date.

20. The computer program product of claim 13, wherein the code that selectively modifies portions of the prior implementation further comprises code that selects and applies a processing algorithm from a plurality of processing algorithms during at least one implementation stage of the incremental implementation flow according to the value of the partition property.

* * * * *